(12) United States Patent
Zhong

(10) Patent No.: US 11,024,567 B2
(45) Date of Patent: Jun. 1, 2021

(54) SMD DIODE TAKING A RUNNER AS BODY AND MANUFACTURING METHOD THEREOF

(71) Applicant: Siyang Grande Electronics Co., Ltd., Suqian (CN)

(72) Inventor: Yunhui Zhong, Suzhou (CN)

(73) Assignee: SIYANG GRANDE ELECTRONICS CO., LTD., Jiangsu (CN)

( * ) Notice: Subject to any disclaimer, the term of this patent is extended or adjusted under 35 U.S.C. 154(b) by 92 days.

(21) Appl. No.: 16/677,150

(22) Filed: Nov. 7, 2019

(65) Prior Publication Data

US 2020/0075465 A1 Mar. 5, 2020

Related U.S. Application Data

(62) Division of application No. 15/361,144, filed on Nov. 25, 2016, now abandoned.

(30) Foreign Application Priority Data

Nov. 26, 2015 (CN) .......................... 201510836602.5
Nov. 26, 2015 (CN) .......................... 201520955973.0

(51) Int. Cl.

| | |
|---|---|
| *H01L 21/56* | (2006.01) |
| *H01L 23/495* | (2006.01) |
| *H01L 21/78* | (2006.01) |
| *H01L 21/66* | (2006.01) |
| *H01L 23/31* | (2006.01) |
| *H01L 29/861* | (2006.01) |
| *H05K 3/34* | (2006.01) |

(52) U.S. Cl.
CPC ...... *H01L 23/49562* (2013.01); *H01L 21/561* (2013.01); *H01L 21/565* (2013.01); *H01L 21/78* (2013.01); *H01L 22/10* (2013.01); *H01L 23/3114* (2013.01); *H01L 23/49551* (2013.01); *H01L 23/49579* (2013.01); *H01L 29/861* (2013.01); *H01L 23/3107* (2013.01); *H05K 3/3426* (2013.01); *H05K 2201/10174* (2013.01); *H05K 2201/10628* (2013.01); *H05K 2201/10651* (2013.01)

(58) Field of Classification Search
CPC ..... H01L 21/561; H01L 21/565; H01L 21/78; H01L 22/10; H01L 23/3114
See application file for complete search history.

(56) References Cited

U.S. PATENT DOCUMENTS

| | | | | | |
|---|---|---|---|---|---|
| 5,023,702 | A | * | 6/1991 | Micic | .................. H01L 21/4885 257/690 |
| 5,508,557 | A | * | 4/1996 | Sunada | ................... H01L 24/37 257/692 |
| 5,821,611 | A | * | 10/1998 | Kubota | ............. H01L 23/49537 257/673 |
| 6,576,986 | B2 | * | 6/2003 | Kobayakawa | .......... H01L 24/40 257/676 |

(Continued)

*Primary Examiner* — Douglas M Menz
(74) *Attorney, Agent, or Firm* — SZDC Law P.C.

(57) ABSTRACT

A surface mount (SMD) diode taking a runner as the body and a manufacturing method thereof are described. An elongated runner groove is adopted to cure and package groups of diode chips arranged side by side and corresponding copper pins thereon, with the utilization rate of epoxy resin up to 90% or more. The use cost of epoxy resin is thus reduced, and environmental pollution is also reduced.

9 Claims, 4 Drawing Sheets

(56) References Cited

U.S. PATENT DOCUMENTS

| | | | | |
|---|---|---|---|---|
| 7,057,273 | B2* | 6/2006 | Harnden | H01L 23/49562 257/696 |
| 2001/0015486 | A1* | 8/2001 | Kobayakawa | H01L 24/36 257/684 |
| 2008/0054287 | A1* | 3/2008 | Oshio | H01L 33/60 257/99 |
| 2009/0053942 | A1* | 2/2009 | Lin | H01R 12/57 439/874 |
| 2011/0026937 | A1* | 2/2011 | Saitou | G02B 6/424 398/201 |
| 2011/0215454 | A1* | 9/2011 | Wang | H01L 23/495 257/676 |
| 2015/0098248 | A1* | 4/2015 | Wakaki | G02B 6/0091 362/611 |

* cited by examiner

SMD DIODE TAKING A RUNNER AS BODY AND MANUFACTURING METHOD THEREOF

CROSS-REFERENCES TO RELATED APPLICATIONS

This application is divisional application of U.S. 15/361,144, filed on Nov. 25, 2016, which claims priority to China Patent Application Nos. 2015108366025 and 2015209559730, both filed on 26 Nov. 2015, which are incorporated by reference in their entirety.

TECHNICAL FIELD

The present disclosure relates to the technical field of semiconductor electronic components, and specifically relates to a surface mount (SMD) diode taking a runner as the body and the manufacturing method thereof.

BACKGROUND

Among the numerous semiconductor electronic components, an SMD diode is a basic component and widely used in various fields. The main existing production process of the SMD diode is as follows: chip test→assembling with a lead frame→sintering→pickling→sizing→baking→plastic packaging→post-curing→waste removing→flattening→cutting ribs and molding→electroplating→printing test→external inspection→packaging→QA inspection-→storage. The main step in the electroplating process is electroplating the positive and negative pins of the diode with tin, with the tinned layer on the positive and negative pins being a plane layer. In welding with the circuit board, the process is troublesome and time-consuming, and the production process of the tinned layer may emit a large amount of toxic and harmful gases, waste water and metal ions, which are prone to causing environmental pollution and harming the health of staff.

In the electronics industry, a diode is typically a basic component of a variety of electronic products. A traditional diode product is provided at both ends with a lead, and needs a through-hole to be drilled in the circuit board to allow the lead to go through so that the traditional diode product is fixed on the circuit board. However, the electronic products currently used around the world, such as telephones, television sets, fax machines, computers and peripheral products, are researched and developed to be thinner and shorter, with the double-layer or multi-layer circuit board technology widely used in the circuit board technology. Since double-layer or multi-layer circuit boards cannot be drilled to have a through-hole therein, in general SMD electronic components are used with circuit boards having two or more layers. For example, SMD resistors have mostly replaced the shaft drive resistors due to low production costs.

A conventional production method of SMD diodes currently in use, as shown in FIG. 1 through FIG. 6, is described below. First, a copper sheet is made into what is as shown in FIGS. 1 and 2, with what is shown in FIG. 1 as the lower layer. Then, a solder sheet or solder paste is placed at the end of each copper sheet in FIG. 1, and a diode chip is placed onto the solder paste. Next, a solder sheet or solder paste is placed onto the chip, and what is shown in FIG. 2 is stacked onto the solder paste. Next, welding is performed with a high-temperature furnace to obtain what is shown in FIG. 3. Next, molding is performed with a high-temperature mold and epoxy resin to obtain what is shown in FIG. 4. Next, blanking is performed to obtain what is shown in FIG. 5. Finally, cutting, bending, and electroplating are performed to obtain what is shown in FIG. 6.

The above-described conventional production process, as the existing mainstream way of producing SMD diodes, has a number of shortcomings. Firstly, the mold occupies a large space, and has poor molding efficiency. Secondly, with the copper sheets on both sides having to be cut off, the utilization rate of copper is 10-15%, thereby undesirably wastes copper while increasing production costs. Thirdly, while molding, the epoxy resin has to go through the middle runner before being ejected toward both sides, and this wastes the runner and may make the epoxy resin injected into the diode ducts on both sides, with the utilization rate of the epoxy resin less than 30%. This is because epoxy resin cannot be recycled, and it is easy to cause environmental pollution. Moreover, the molded SMD diode is a single-chip SMD diode after being cut. Afterwards the copper pin of each SMD diode needs to be electroplated with tin, which has low production efficiency. Besides, in the production process of electroplating tin, a large amount of toxic and harmful gases, waste water and metal ions will be emitted, thus prone to causing environmental pollution and harming the health of staff.

SUMMARY

A purpose of the present disclosure is to provide an SMD diode taking a runner as the body, which has a simple structure, is easier to be welded to the circuit board, and improves the production efficiency. A method of manufacturing the SMD diode taking a runner as the body is also provided. The proposal not only can save copper and epoxy resin and reduce the space occupied by the mold, but also have improved production efficiency and environmental protection effect by first dipping the copper pin into tin and then cutting.

In one aspect an SMD diode taking a runner as the body may include a chip, a positive pin, a negative pin connected respectively with upper and lower surfaces of the chip, and a plastic-packaged body wrapped on an outside of the chip. Both the positive pin and the negative pin, each having two bends, may extend out of a bottom of the plastic-packaged body in two opposite directions. A cambered surface may be provided on a part of each of the positive pin and the negative pin extending out of the plastic-packaged body.

In some implementations, each of the positive pin and the negative pin may include a sheet copper pin having two bends each at an angle of 90°.

In some implementations, each of the positive pin and the negative pin may be provided with a tin solder layer at a respective junction with the chip.

In some implementations, the upper and lower surfaces of the plastic-packaged body may be smooth, and surfaces of both sides of the positive pin and the negative pin may be rough.

In some implementations, an external shape of the plastic-packaged body may be rectangular.

In one aspect, a passive electronic component may include multiple groups of SMD diodes that are arranged side by side. Each of the SMD diodes may include a chip, a positive pin, a negative pin connected respectively with upper and lower surfaces of the chip, and a plastic-packaged body wrapped on an outside of the chip. Both the positive pin and the negative pin, each having two bends, may extend out of a bottom of the plastic-packaged body in two opposite directions. A cambered surface may be provided on a part of each of the positive pin and the negative pin extending out of the plastic-packaged body. The plastic-packaged bodies of adjacent SMD diodes may be integrally molded.

In some implementations, for each of the SMD diodes, each of the positive pin and the negative pin may include a sheet copper pin having two bends each at an angle of 90°.

In some implementations, for each of the SMD diodes, each of the positive pin and the negative pin may be provided with a tin solder layer at a respective junction with the chip.

In some implementations, for each of the SMD diodes, the upper and lower surfaces of the plastic-packaged body may be smooth, and surfaces of both sides of the positive pin and the negative pin may be rough.

In some implementations, for each of the SMD diodes, an external shape of the plastic-packaged body may be rectangular.

In one aspect, a method of manufacturing an SMD diode taking a runner as the body may include: (1) welding and filming multiple groups of diode chips and corresponding copper pins thereon simultaneously; (2) disposing the multiple groups of the welded diode chips and the corresponding copper pins thereon side by side into an elongated runner groove of an injection mold; (3) injecting a plastic-packaging material into the elongated runner groove; (4) curing and packaging the multiple groups of the welded diode chips and the corresponding copper pins thereon simultaneously to obtain a plastic-packaged body containing the multiple groups of the diode chips and the copper pins thereon; (5) dipping a part of the copper pins extending out of the plastic-packaged body into a liquid tin; (6) cutting the plastic-packaged body, which contains the multiple groups of the diode chips and the copper pins thereon, into a plurality of single-chip SMD diodes; and (7) testing and packaging the plurality of single-chip SMD diodes.

In some implementations, when each group of the multiple groups of diode chips comprises one diode chip, the one diode chip may be welded to corresponding two of the copper pins. When each group of the multiple groups of diode chips comprises two diode chips, the two diode chips may be welded to corresponding three of the copper pins. When each group of the multiple groups of diode chips comprises four diode chips, the four diode chips may be welded to corresponding four of the copper pins.

In some implementations, each of the copper pins may include a sheet copper pin bent twice each time at an angle of 90°.

In some implementations, each of the copper pins may include a sheet copper pin bent twice each time at an angle of 90°.

In some implementations, the plastic-packaging material may include epoxy resin.

In some implementations, after the dipping of the part of the copper pins extending out of the plastic-packaged body into the liquid tin, a tin-dipped layer having a cambered surface may be formed on the part of the copper pins extending out of the plastic-packaged body under surface tension effect of the liquid tin.

In some implementations, after the cutting of the plastic-packaged body is finished, upper and lower surfaces of the plastic-packaged body of each single-chip SMD diode may be smooth, and surfaces of both sides of the copper pins may be rough.

The present disclosure has a number of advantages described below. Firstly, this tin-dipped layer having a cambered surface of the present disclosure is naturally formed under the surface tension effect of the liquid tin during the tin-dipping process of the positive and negative pins. When welded to a circuit board, the positive and negative pins with an arc are easier to be welded successfully to the circuit board, which not only improves the production efficiency, but also basically produces no toxic and harmful gases, waste water or metal ions during the tin-dipping process compared to the tin electroplating process. This is good for environmental protection and less likely to harm the health of staff. Secondly, the present disclosure adopts a copper pin for welding directly, with the utilization rate of copper reaching 100 percent, greatly reducing the use cost of copper. Thirdly, the present disclosure adopts the elongated runner groove to cure and package the groups of the diode chips arranged side by side and the corresponding copper pins thereon, with the utilization rate of epoxy resin up to 90% or more, thus reducing the use cost of epoxy resin while reducing environmental pollution. Fourthly, the copper pin of the present disclosure adopts the tin-dipping method instead of the traditional tin-electroplating method, with a tin-dipped layer having a cambered surface formed on the part of the copper pin extending out of the plastic-packaged body under the surface tension effect of the liquid tin. When welded to a circuit board, the copper pin with an arc is easier to be welded to the circuit board successfully, which not only improves the production efficiency, but also basically produces no toxic and harmful gases, waste water or metal ions during the tin-dipping process compared to the tin electroplating process. This is good for environmental protection and less likely to harm the health of staff.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

In FIG. 7 to FIG. 10, numeral reference and respective elements are as follows: 1. a chip; 2. a positive pin; 3. a negative pin; 4. a plastic-packaged body; 5. a tin-dipped layer; and 6. a tin solder layer.

DETAILED DESCRIPTION OF PREFERRED EMBODIMENTS

Figure 10:
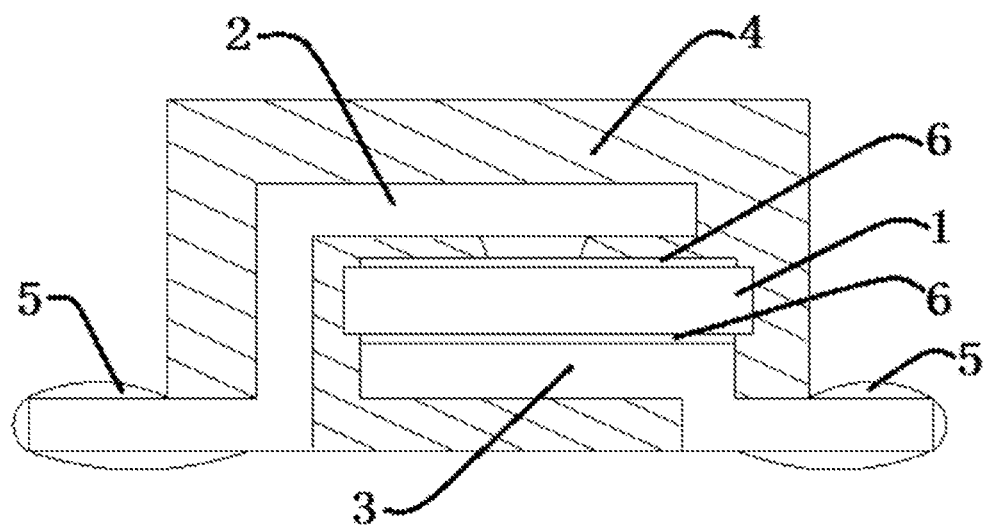
FIG. 10 is a sectional view showing the structure of an SMD diode of the present disclosure.

As shown in FIG. 10, an SMD diode taking a runner as the body is provided and may include the following components: a chip 1, a positive pin 2 and a negative pin 3 connected respectively with the upper and lower surfaces of chip 1, and a plastic-enclosed body 4 wrapped on the outside of the chip 1. Both the positive pin 2 and the negative pin 3, after bent twice (e.g., having two bends), extend out of the bottom of the plastic-enclosed body 4 to the outside of the plastic-enclosed body 4 in two opposite directions. On the part of positive pin 2 and negative pin 3 extending out of the plastic-packaged body 4, a tin-dipped layer 5 having a cambered surface may be provided.

Both the positive pin 2 and the negative pin 3 of the present disclosure may be provided with a sheet copper pin bent twice with each bend being at an angle of 90° (e.g., with the two bends being in two opposite directions). The positive pin 2 and the negative pin 3 may be provided with a tin solder layer 6 at the junction with the chip 1. The external shape of the plastic-packaged body 4 may be rectangular.

When in use, the SMD diode of the present disclosure may be affixed to a circuit board, and thus the positive pin 2 and the negative pin 3 may be directly welded to a circuit on the circuit board. The tin-dipped layer 5 on the positive pin 2 and the negative pin 3 may be naturally formed under the surface tension effect of liquid tin during the tin-dipping process of the positive pin 2 and the negative pin 3. When welded to a circuit board, the positive pin 2 and the negative pin 3 with an arc may be easier to be welded successfully to the circuit board. This not only improves the production efficiency but also basically produces no toxic and harmful gases, waste water or metal ions during the tin-dipping process compared to tin electroplating process. Advantageously, the proposal of the present disclosure promotes environmental protection and is less likely to cause harm to the health of staff.

Figure 1:
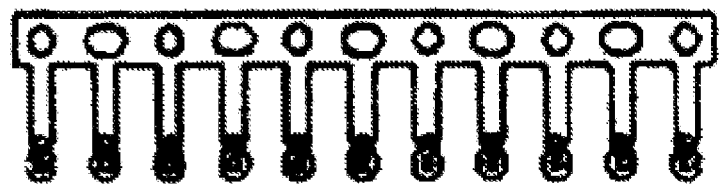
FIG. 1 to FIG. 6 are schematic views showing a current method of manufacturing an SMD diode.
Figure 2:
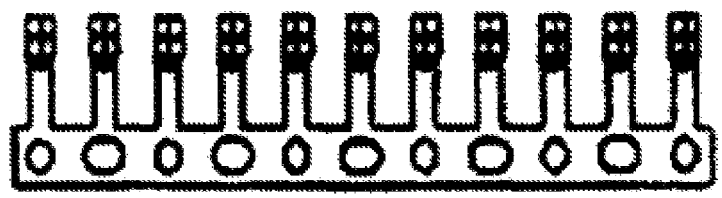
Figure 3:
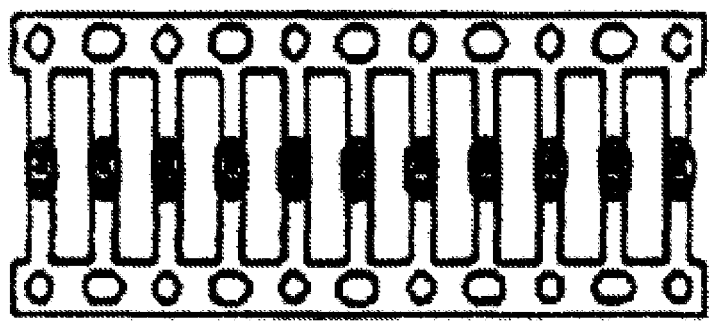
Figure 4:
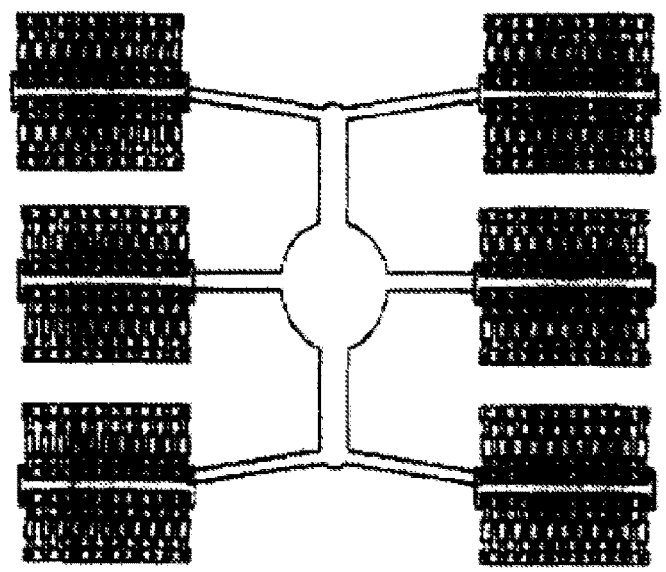
Figure 5:
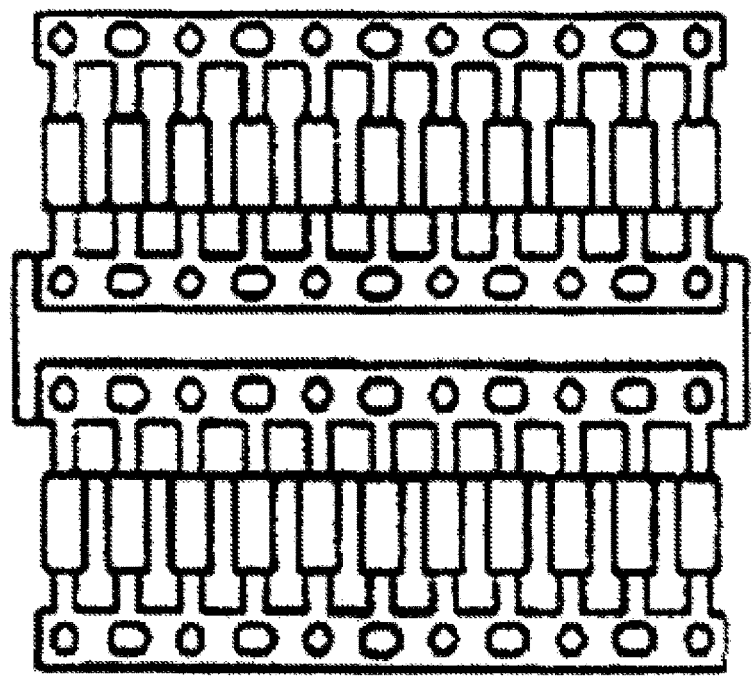
Figure 6:
Figure 7:
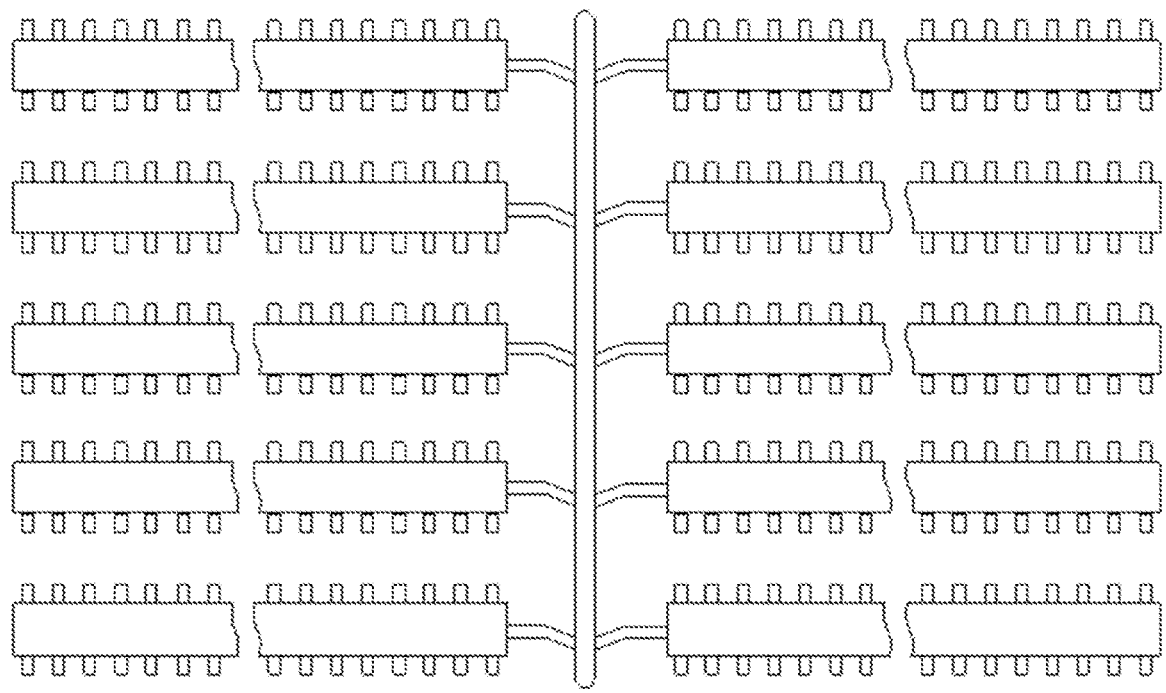
FIG. 7 is a schematic view showing the structure of a mold of the present disclosure.
Figure 8:
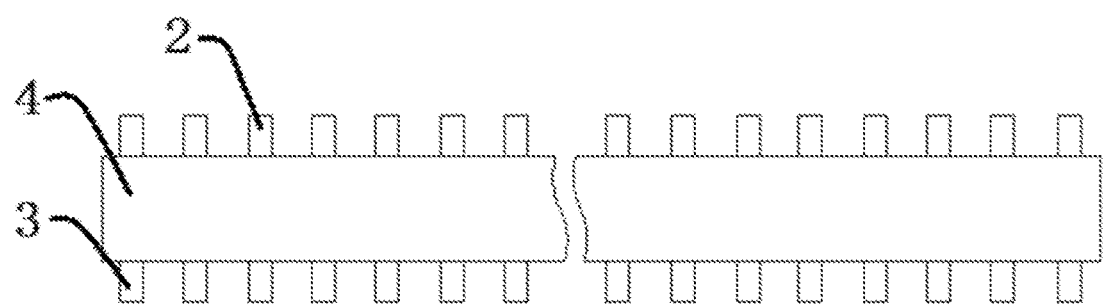
FIG. 8 is a schematic view showing the structure of an SMD diode assembly of the present disclosure.
Figure 9:
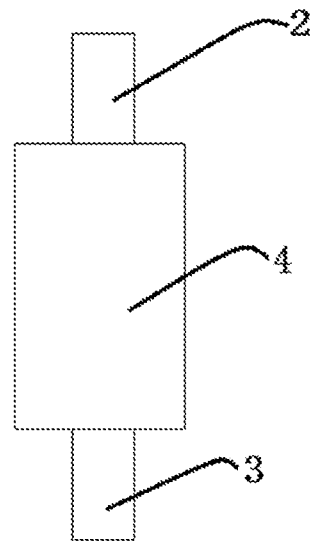
FIG. 9 is a schematic view showing the structure of an SMD diode of the present disclosure.

As shown in FIG. 8, a passive electronic component is provided and may include multiple groups of the SMD diodes arranged side by side, with the plastic-packaged bodies 4 of adjacent SMD diodes integrally molded. Before being used, the SMD diode assembly may be cut into multiple single-chip SMD diodes in a cutting process. Accordingly, the upper and lower surfaces of the plastic-packaged body 4 may be smooth, and the surfaces of both sides of the positive pin 2 and the negative pin 3 (e.g., the face of cut) may be rough. The single-chip SMD diode may be affixed to a circuit board, and the positive pin 2 and the negative pin 3 may be directly welded to a circuit on the circuit board. Advantageously, the proposed electronic component not only has a simple structure but also a simple process and high production efficiency, with the plastic-packaging materials and copper having high utilization rate and reduced production costs in the production process.

As shown in FIGS. 7-10, a manufacturing method of the SMD diode taking a runner as the body is provided. Example steps, actions and/or operations of the manufacturing method are described below.

In step (1) (welding), welding and filming of multiple groups of diode chips and corresponding copper pins thereon may be performed simultaneously. Each group of diode chips may include at least one diode chip 1, which may be welded to two corresponding copper pins (the positive pin 2 and the negative pin 3) each of which may be a sheet copper pin bent twice at an angle of 90° at each bend.

In step (2) (packaging and molding), the multiple groups of the welded diode chips and the corresponding copper pins thereon may be placed side by side into an elongated runner groove of an injection mold. Then, a plastic-packaging material may be injected into the elongated runner groove. Next, curing and packaging of the multiple groups of the diode chips and the corresponding copper pins thereon may be performed simultaneously. Thus, a plastic-packaged body 4 of the multiple groups of the diode chips and the copper pins thereon may be obtained.

In step (3) (tin dipping), the aforementioned plastic-packaged body with the built-in multiple groups of the diode chips and the copper pins thereon may be taken out, and the part of the copper pins extending out of the plastic-packaged body 4 may be dipped into a liquid tin. After completing tin dipping and under the surface tension effect of the liquid tin, a tin-dipped layer 5 having a cambered surface may be formed on the part of the copper pin extending out of the plastic-packaged body 4.

In step (4) (cutting), the aforementioned plastic-packaged body 4 with the built-in multiple groups of the diode chips and the copper pins thereon may be cut into multiple ones of single-chip SMD diodes. Therefore, the upper and lower surfaces of the plastic-packaged body 4 of the single-chip SMD diode may be smooth, while the surfaces of both sides of the copper pin (e.g., the face of cut) may be rough.

In step (5) (testing and packaging), testing and packaging of the single-chip SMD diodes may be performed.

In step (1) of the manufacturing method in accordance with the present disclosure, each group of diode chips may also include two or four of diode chip 1. When a group includes two diode chips 1, the diode chips may be welded to corresponding three of the copper pins. When a group includes four of diode chip 1, the diode chips may be welded to corresponding four of the copper pins. The plastic-packaging material may be epoxy resin.

The present disclosure not only provides an SMD diode taking a runner as the body and the manufacturing method thereof, but can also be extended to all passive electronic components, with all the passive electronic components taking a runner as the body and the manufacturing method thereof being also within the scope of protection of this patent.

The above examples only illustrate the principle and effect of the present disclosure, instead of limiting the present disclosure. Those skilled in the art can make modifications and variations to the above examples without departing from the spirit and scope of the present disclosure. Therefore, it is intended that the appended claims of the present disclosure cover all the equivalent modifications and variations made by those of ordinary skill in the art to the present disclosure without departing from the spirit and technical idea of the present disclosure.

What is claimed is:

1. A method of manufacturing a surface mount (SMD) diode taking a runner as the body, the method comprising:
    welding and filming multiple groups of diode chips and corresponding copper pins thereon simultaneously;
    disposing the multiple groups of the welded diode chips and the corresponding copper pins thereon side by side into an elongated runner groove of an injection mold;
    injecting a plastic-packaging material into the elongated runner groove;
    curing and packaging the multiple groups of the welded diode chips and the corresponding copper pins thereon simultaneously to obtain a plastic-packaged body containing the multiple groups of the diode chips and the copper pins thereon;
    dipping a part of the copper pins extending out of the plastic-packaged body into a liquid tin;
    cutting the plastic-packaged body, which contains the multiple groups of the diode chips and the copper pins thereon, into a plurality of single-chip SMD diodes; and
    testing and packaging the plurality of single-chip SMD diodes.

2. The method of claim 1, wherein, when each group of the multiple groups of diode chips comprises one diode chip, the one diode chip is welded to corresponding two of the copper pins, wherein, when each group of the multiple groups of diode chips comprises two diode chips, the two diode chips are welded to corresponding three of the copper pins, and wherein, when each group of the multiple groups of diode chips comprises four diode chips, the four diode chips are welded to corresponding four of the copper pins.

3. The method of claim 1, wherein each of the copper pins comprises a sheet copper pin bent twice each time at an angle of 90°.

4. The method of claim 2, wherein each of the copper pins comprises a sheet copper pin bent twice each time at an angle of 90°.

5. The method of claim 1, wherein the plastic-packaging material comprises epoxy resin.

6. The method of claim 1, wherein after the dipping of the part of the copper pins extending out of the plastic-packaged body into the liquid tin, a tin-dipped layer having a cambered surface is formed on the part of the copper pins extending out of the plastic- packaged body under surface tension effect of the liquid tin.

7. The method of claim 1, wherein after the cutting of the plastic-packaged body is finished, upper and lower surfaces of the plastic-packaged body of each single-chip SMD diode are smooth, and wherein surfaces of both sides of the copper pins are rough.

8. A surface mount diode (SMD) prepared in accordance with the method of claim 1.

9. A passive electronic component, comprising: multiple groups of the surface mount diodes (SMD) of claim 8 that are arranged side by side.

* * * * *